(12) United States Patent
Lee et al.

(10) Patent No.: US 6,831,844 B1
(45) Date of Patent: Dec. 14, 2004

(54) ELECTRONIC CIRCUIT UNIT PROVIDING EMI SHIELDING

(75) Inventors: Cindy Lee, Kanata (CA); Mitchell J. O'Leary, Ottawa (CA)

(73) Assignee: Nortel Networks Limited, St-Laurent (CA)

( * ) Notice: Subject to any disclaimer, the term of this patent is extended or adjusted under 35 U.S.C. 154(b) by 0 days.

(21) Appl. No.: 10/669,340

(22) Filed: Sep. 25, 2003

Related U.S. Application Data

(62) Division of application No. 09/987,041, filed on Nov. 13, 2001, now abandoned.

(51) Int. Cl.[7] .............................. H05K 9/00; H05K 5/02
(52) U.S. Cl. ....................... 361/818; 361/816; 361/800; 361/752; 361/796; 174/35 R; 174/35 GC
(58) Field of Search .................................. 361/704, 707, 361/709, 712, 714, 715, 800, 728–731, 752, 796, 816, 818; 174/35 R, 35 GC

(56) References Cited

U.S. PATENT DOCUMENTS

| | | | | |
|---|---|---|---|---|
| 4,837,664 A | * | 6/1989 | Rodriguez et al. | 361/716 |
| 5,880,930 A | * | 3/1999 | Wheaton | 361/690 |
| 6,166,919 A | * | 12/2000 | Nicolici et al. | 361/800 |
| 6,219,239 B1 | * | 4/2001 | Mellberg et al. | 361/704 |
| 6,414,597 B1 | * | 7/2002 | Lu et al. | 340/572.7 |
| 6,671,183 B2 | * | 12/2003 | Tsuzuki | 361/797 |
| 6,748,154 B2 | * | 6/2004 | O'Leary et al. | 385/135 |

* cited by examiner

Primary Examiner—Kamand Cuneo
Assistant Examiner—Dameon E. Levi

(57) ABSTRACT

An electronic circuit unit for use in an electronic equipment cabinet. The electronic circuit unit has first and second opposite main walls including EMI absorbing material and a motherboard frame between the main walls, the motherboard frame including a plurality of wall segments also including EMI absorbing material. A motherboard is mounted in the motherboard frame by a first locating retainer. The first locating retainer positions the motherboard such that it resides between the main walls of the electronic circuit unit. A signal-processing module forming at least a portion of the first main wall is removably mounted to the motherboard frame by a second locating retainer. The signal-processing module connects with the motherboard through an electrical connector having mating parts. The first and the second locating retainers are positioned relative to one another to allow the mating parts to align and mate when the signal processing module is fastened to said motherboard frame.

13 Claims, 5 Drawing Sheets

US 6,831,844 B1

ELECTRONIC CIRCUIT UNIT PROVIDING EMI SHIELDING

This application is a Division of Ser. No. 09/987,041 filed Nov. 13, 2001, now abandoned.

FIELD OF THE INVENTION

The invention relates to assembly and packaging of signal processing devices, in particular to an electronic circuit unit that provides EMI shielding, is simple to assemble and provides good structural integrity.

BACKGROUND OF THE INVENTION

Devices used in communication networks, such as routers or switches to name a few, are constructed as cabinets with a bay where a plurality of standard size electronic circuit units are inserted. The electronic circuit units all connect to a main circuit board, such as a backplane or a midplane, through which data is transferred from each electronic circuit unit to other components.

Electronic circuit units that are currently available suffer from a number of drawbacks. The most significant ones are complexity of assembly and poor structural integrity, which translates into poor connector alignment tolerances for components within the unit or between the unit and the main circuit board of the cabinet.

Against this background there exists in the industry a need to provide an electronic circuit unit that is relatively simple to assemble and at the same time provides good structural integrity.

SUMMARY OF THE INVENTION

In one broad aspect, the invention provides an electronic circuit unit for use in an electronic equipment cabinet. The electronic circuit unit has first and second opposite main walls including EMI absorbing material and a motherboard frame between the main walls, the motherboard frame including a plurality of wall segments also including EMI absorbing material.

A motherboard is mounted in the motherboard frame by a first locating retainer. The first locating retainer positions the motherboard such that it resides between the main walls of the electronic circuit unit. A signal-processing module forming at least a portion of the first main wall is removably mounted to the motherboard frame by a second locating retainer. The signal-processing module connects with the motherboard through an electrical connector having mating parts. The first and the second locating retainers are positioned relative to one another to allow the mating parts to align and mate when the signal processing module is fastened to said motherboard frame.

This electronic circuit unit is advantageous for a number of reasons. First, the electronic circuit unit is easier to assemble by virtue of the motherboard frame to which the motherboard is directly mounted. Secondly, the structural integrity of the electronic circuit unit is enhanced.

In one specific and non-limiting example of implementation, the motherboard frame is generally rectangular and made of metallic material. Both main walls are removably fastened to the motherboard frame by respective locating retainers. An optional feature that enhances the cooling capacity of the electronic circuit unit is to provide each main wall with a heat sink and to thermally couple the two main walls through the motherboard such that heat generated by a component associated to one of the main walls can be transferred to the other main wall.

In a second broad aspect, the invention provides a motherboard frame for an electronic circuit unit. The motherboard frame has a plurality of wall segments including EMI absorbing material and arranged in a plane of reference, the wall segments circumscribing a void area having first and second opposite open sides. The wall segments have first, second and third locating devices spaced from one another in a direction that is transverse to the plane of reference. The first locating device is capable of receiving a planar motherboard and placing the motherboard in the motherboard plane, parallel to the plane of reference and in a predetermined position between the second and third locating devices.

In a third broad aspect, the invention provides a combination including a motherboard frame and a motherboard. The motherboard frame has a plurality of wall segments including EMI absorbing material and arranged in a plane of reference, the wall segments circumscribing a void area having first and second opposite open sides. At least some of the wall segments carry first, second and third locating devices that are spaced from one another in a direction that is transverse to the plane of reference. The motherboard is generally planar and it has an outline generally corresponding to the outline of the void area such as to allow the motherboard to be mounted in the motherboard frame. The first locating device is capable of receiving the planar motherboard and locating the motherboard parallel to the plane of reference and in a predetermined position between the second and third locating devices. The second locating device and the outline of the motherboard have respective geometrical configurations such that the motherboard can be inserted in the motherboard frame from one of the open sides without interference from the second locating device.

BRIEF DESCRIPTION OF THE DRAWINGS

A detailed description of examples of implementation of the present invention is provided hereinbelow with reference to the following drawings, in which.

Figure 1:
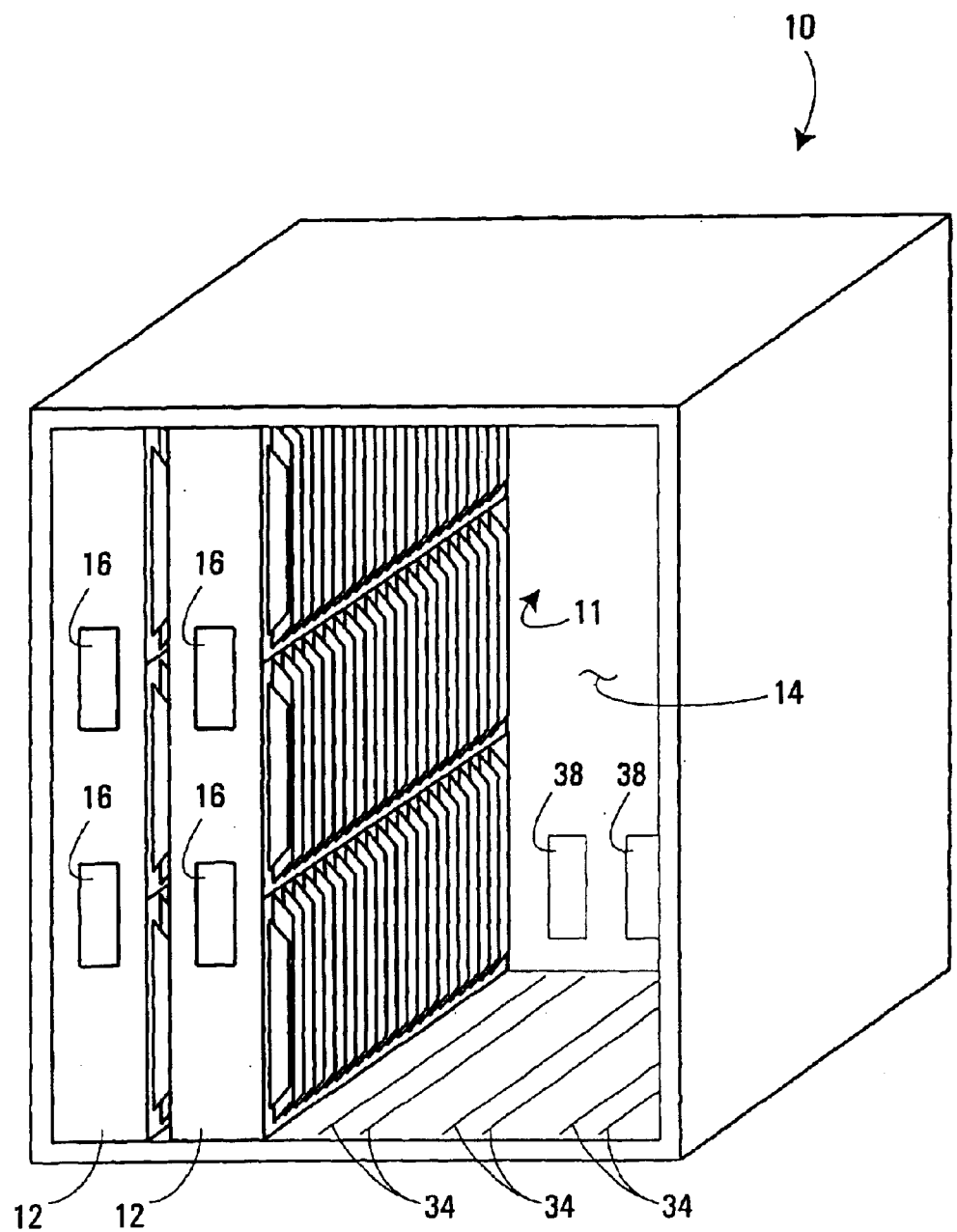
FIG. 1 is a perspective view of an electronic equipment cabinet.

In the drawings, embodiments of the invention are illustrated by way of example. It is to be expressly understood that the description and drawings are only for purposes of illustration and as an aid to understanding, and are not intended to be a definition of the limits of the invention.

DETAILED DESCRIPTION

FIG. 1 illustrates an electronic equipment cabinet 10. The cabinet 10 has a frame that defines a bay 11 receiving standardized electronic circuit units 12. The electronic circuit units 12 are shaped as rectangular boxes that slide in the bay 11 and electrically connect with a main circuit board 14. The main circuit board 14 may be in the form of a back plane, in the form of a mid plane or under any other suitable configuration without departing from the invention.

The function performed by the electronic equipment cabinet 10 is in itself of little importance to the present inventive concept. Accordingly, this function can widely vary without departing from the invention. In one example of implementation, the electronic equipment cabinet 10 is a router. Data transport media (not shown), such as optical fibers connect to couplers 16 on the individual electronic circuit units 12. The individual electronic circuit units 12 perform the necessary data processing on data received from the data transport media or sent on the data transport media. Data can be exchanged internally from any one of the electronic circuit units 12 to another electronic circuit unit 12 or a different device through the main circuit board 14.

Figure 2:
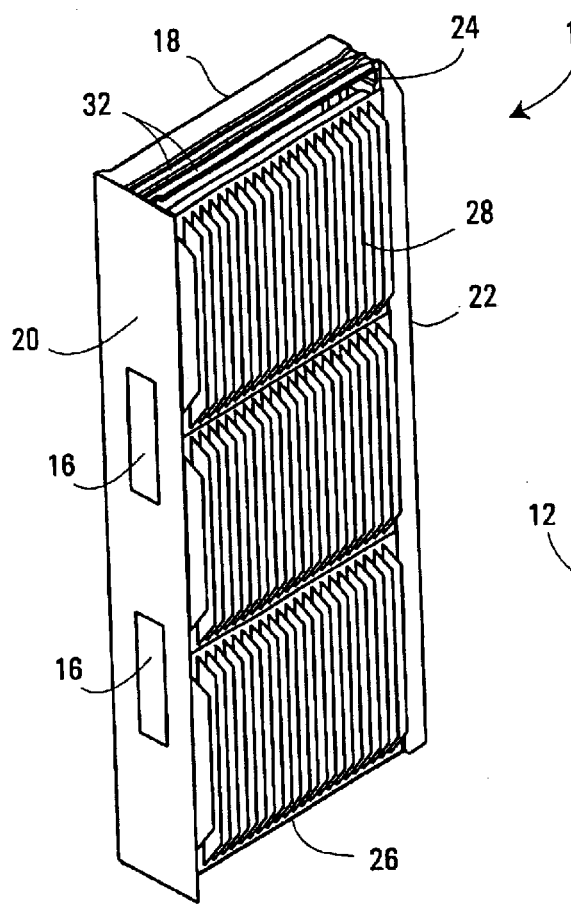
FIG. 2 is a front perspective view of an electronic circuit unit for installation in the electronic equipment cabinet shown in FIG. 1.
Figure 3:
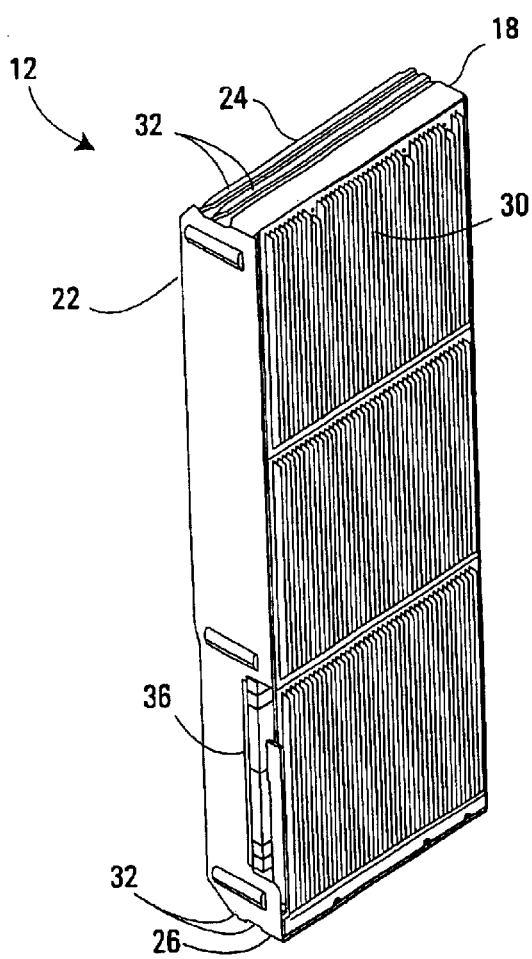
FIG. 3 is a rear perspective view of the electronic circuit unit shown in FIG. 2.

With reference to FIGS. 2 and 3, the electronic circuit unit 12 includes a rectangular motherboard frame 18. The motherboard frame 18 has a plurality of wall segments all situated in an imaginary plane of reference. The wall segments include a front wall 20, a rear wall 22, a top wall 24 and a bottom wall 26. Two main walls 28 and 30 are attached to the motherboard frame 18 to complete the unit 12. The main walls 28 and 30 are parallel to the plane of reference of the motherboard frame 18.

The motherboard frame 18 includes a guide for locating the electronic circuit unit 12 in the cabinet 10. In one form of implementation, the guide includes a pair of grooves 32 formed on the top wall 24 and on the bottom wall 26 (the grooves on the bottom wall are not shown in the drawings). As it can be seen in FIG. 1, the grooves 32 mate with corresponding projections 34 when the electronic circuit unit 12 is inserted in the bay 11. The grooves 32 and the projections 34 form a registration device allowing to precisely position the electronic circuit unit 12 in the bay 11. The reader will appreciate that a wide variety of mechanical structures can be used to provide a suitable registration device for use with this invention.

The rear wall 22 includes a passage 36 for receiving an electrical connector allowing establishing an electrical connection between the electronic circuit unit 12 and the main circuit board 14. In a specific and non-limiting example of implementation, such electrical connector includes two mating parts: one formed on the electronic circuit unit 12 and the other on the main circuit board 14. When the electronic circuit unit 12 is inserted in the bay 11, the registration device keeps the mating parts in alignment such that when the electronic circuit unit 12 reaches the main circuit board 14, the mating parts will engage one another and complete the electrical connection. For reference, FIG. 1 shows at 38 the location of the connector parts on the circuit board 14 that mate with connector parts on respective electronic circuit units 12.

Figure 4:
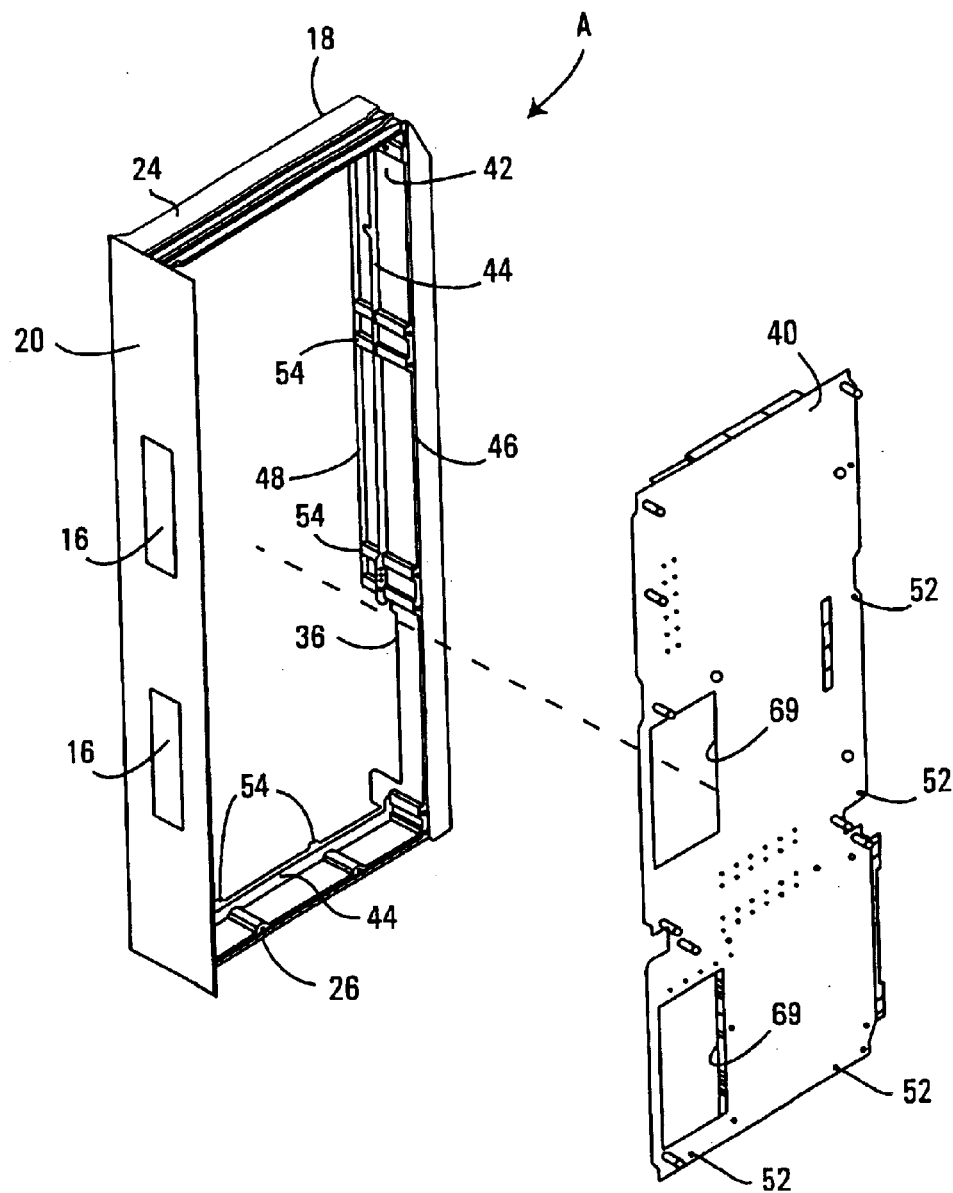
FIG. 4 is an exploded perspective view of a motherboard frame of the electronic circuit unit and of a motherboard for insertion in the motherboard frame.

With reference to FIG. 4, the motherboard frame 18 is integrally formed from metallic material that provides electromagnetic interference (EMI) shielding. The motherboard frame 18 receives a motherboard 40 therein. More specifically, the motherboard frame 18 defines a void area dimensioned to accurately match the outline of the motherboard 40. The motherboard 40 is inserted in this void area through one of the open sides of the motherboard frame 18 and retained to the motherboard frame 18 by a locating retainer. In particular, the electronic circuit unit 12 has three such locating retainers. There is one locating retainer for the motherboard 40, one for the main wall 28 and one for the main wall 30. Each locating retainer is comprised of a locating device and of a fastening device. The locating device positions the component (motherboard 40, main wall 28 or 30) in a predetermined position with respect to the motherboard frame 18, while the fastening device locks the component in place.

The inner sides of the walls 20, 22, 24 and 26 (the sides facing the void area) include a projection 42 that is continuous along the periphery of the motherboard frame. The projection 42 integrates the locating devices used to position the motherboard 40 and the main walls 28 and 30. Specifically, the projection 42 defines a locating device 44 in the form of a rib located intermediate the lateral edges of the projection 42. The projection 42 also defines two other locating devices 46 and 48 formed by the lateral edges of the projection 42, respectively. Thus, the locating devices 44, 46 and 48 are spaced from one another along a direction that is transverse the plane of reference of the motherboard frame 18.

The motherboard 40 is installed in the motherboard frame 18 by inserting it through the open side of the motherboard frame marked A in FIG. 4. The outline of the motherboard 40 and the locating device 48 are such that the motherboard 40 will clear the locating device 48 and then abut against the locating device 44. Screws (not shown) are inserted through apertures 52 in the motherboard 40 and threadedly engaged into tapped bores 54 on the projection 42. The screws form the fastening device of the locating retainer for the motherboard 40. It will be plain to a person skilled in the art that fastening devices other than screws can be used without departing from the spirit of the invention.

Figure 5:
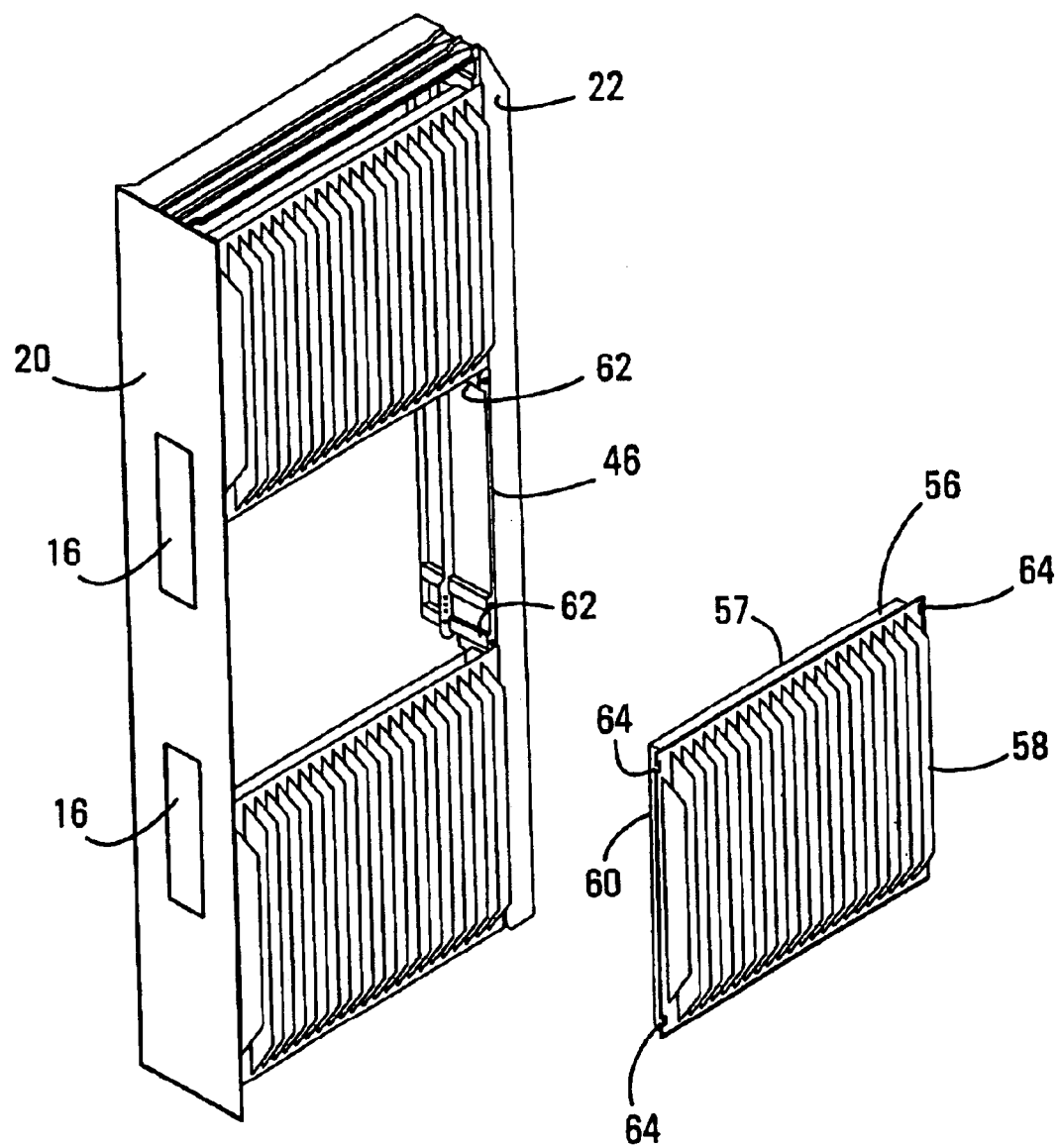
FIG. 5 is an exploded view of the electronic circuit unit showing the mounting of electronic processing modules that form one of the main walls of the electronic circuit unit.

FIG. 5 illustrates the installation of the main wall 28. That main wall 28 is comprised of a plurality of signal processing modules 56 placed side-by-side that form the main wall 28. Alternatively, the main wall 28 can be formed by a single signal-processing module, by two signal-processing modules or by more than three signal-processing modules. Each signal-processing module 56 includes opto-electronic signal-processing circuitry 57 mounted to a heat sink 58 in the form of parallel fins. The heat sink 58 is made of metallic material and provides EMI shielding. The signal processing circuitry 57 is housed in a casing dimensioned to clear the locating device 46 when the signal-processing module 56 is mounted to the motherboard frame 18. The heat sink 58 has a laterally projecting flange 60 that abuts against the locating device 46. Screws (not shown) secure the signal-processing module 56 to the motherboard frame 18. The screws are received in tapped bores 62 on the motherboard frame and corresponding slots 64 on the flange 60.

For added support, transverse bars (not shown in the drawings) can be placed across the motherboard frame 18, extending from the front wall 20 to the rear wall 22. The bars are located at a juncture between two signal-processing modules 56 such as to provide the motherboard frame 18 with additional load bearing capability in the area where two adjacent signal-processing modules 56 meet. The transverse bars also provide a surface on which an EMI gasket (of a type known in the art) can be applied allowing closing gaps between adjacent signal-processing modules 56.

At least one of the signal processing modules 56 electrically connects with the motherboard 40. This is effected via an electrical connector (not shown) having two mating parts, one part being formed on the motherboard 40 and one part on the signal-processing module 56. The locating device 46 serves to position the signal-processing module 56 such that both mating parts of the connector are aligned and will mate when the signal-processing module 56 is fully inserted in the motherboard frame 18.

Figure 6:
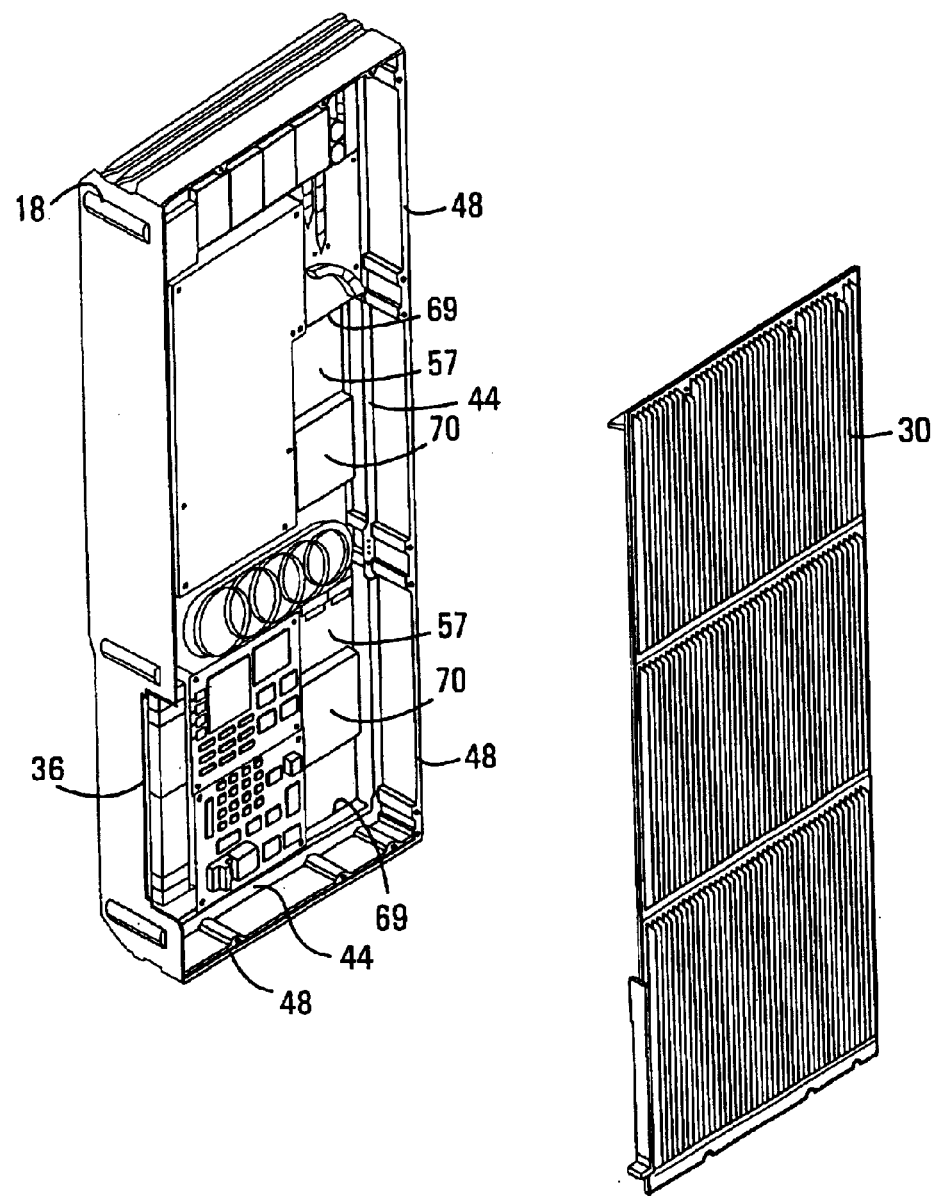
FIG. 6 is an exploded view of the electronic circuit unit showing the mounting of a heat sink panel forming the other main wall of the electronic circuit unit.

The installation of the main wall 30 is shown in FIG. 6. The main wall 30 is a unitary component, however it can be formed as an assembly of smaller components without departing from the spirit of the invention. The main wall 30 includes a heat sink 58 in the form of parallel fins made of metallic material to provide EMI shielding. Optionally, electronic or optical components can be secured to the heat sink 58. If desired, those components can connect with the motherboard 40 or with other elements of the electronic circuit unit 12.

When the main wall 30 is closed, the electronic circuit unit 12 forms a structure that is completely enclosed by panels including EMI absorbing material to provide effective EMI shielding for internal components.

Optionally, the electronic circuit unit 12 has a thermal coupling between the main walls 28 and 30 to allow heat produced by a component mounted to one of the main walls to transfer at least some part of the heat to the other main wall. This feature enhances the cooling capacity of the electronic circuit unit 12. In a specific example of implementation, two such thermal couplings are provided, one for each of the two lower signal-processing modules 56 (there is no such thermal coupling for the upper signal-processing module 56).

As shown in FIG. 6, the motherboard 40 is provided with passages 69 to accommodate the thermal couplings. The thermal couplings include material extending transversally from one main wall to the other main wall to provide a pathway over which thermal energy can travel efficiently. In the example shown in FIG. 6, the casing 57 of the two lower signal-processing modules 56 has a projection 70 that is received in the respective passage 69. The projection 70 holds one or more heat-generating components from the signal-processing module 56. In one form of implementation, the projection 70 is long enough such as to make physical contact with the main wall 30 when the main wall 30 is mounted to the motherboard frame 18. Alternatively the main wall 30 includes a projection (not shown) that is aligned and engages the projection 70 when the main wall 30 is mounted to the motherboard frame 18. Yet another possibility is to provide on the main wall 30 apertures through which fluid heat conductive material is injected to complete the thermal pathway from the projection 70 to the main wall 30. This fluid heat conductive material is known to those skilled in the art. The material is in the form of a paste that can be injected in the motherboard frame and when it sets it provides an efficient thermal transfer.

Although various embodiments have been illustrated, this was for the purpose of describing, but not limiting, the invention. Various modifications will become apparent to those skilled in the art and are within the scope of this invention, which is defined more particularly by the attached claims.

What is claimed is:

1. An electronic circuit unit for use in an electronic equipment cabinet, said electronic circuit unit comprising:
   a. first and second opposite main walls including EMI absorbing material;
   b. a motherboard frame between said main walls, said motherboard frame including a plurality of wall segments defining a polygon, said motherboard frame including EMI absorbing material;
   c. first and second locating retainers on said motherboard frame;
   d. a signal-processing module forming at least a portion of said first main wall, said signal-processing module being removably mounted to said motherboard frame;
   e. a generally planar motherboard in said motherboard frame fastened to said motherboard frame by said first locating retainer, said first locating retainer being positioned on said motherboard frame to locate said motherboard between said main walls;
   f. said signal-processing module being fastened to said motherboard frame by said second locating retainer;
   g. at least one electrical connector including first and second mating parts, said first mating part being on said motherboard, said second mating part being on said signal-processing module;
   h. said first and said second locating retainers being positioned relative to one another to allow said first and said second mating parts to align and mate when said signal-processing module is fastened to said motherboard frame.

2. An electronic circuit unit as defined in claim 1, wherein said polygon is a rectangle.

3. An electronic circuit unit as defined in claim 2, wherein said electrical connector is a first electrical connector, one of said wall segments including a passage for receiving a second electrical connector.

4. An electronic circuit unit as defined in claim 3, wherein said motherboard frame includes a guide for locating said electronic circuit unit in a certain position in the electronic equipment cabinet when mounted therein.

5. An electronic circuit unit as defined in claim 4, wherein said guide includes a plurality of grooves formed on wall segments of said motherboard frame that are opposite one another.

6. An electronic circuit unit as defined in claim 4, wherein said first main wall includes a heat sink.

7. An electronic circuit unit as defined in claim 6, wherein said second main wall includes a heat sink.

8. An electronic circuit unit as defined in claim 7, wherein said first main wall includes a plurality of signal processing modules.

9. An electronic circuit unit as defined in claim 8, wherein said plurality of signal processing modules process optical signals.

10. An electronic circuit unit as defined in claim 7, comprising a thermal coupling between said signal processing module and said second main wall, said thermal coupling transferring thermal energy from said signal processing module to said second main wall.

11. An electronic circuit unit as defined in claim 10, wherein said motherboard has a passage through which said thermal coupling is realized.

12. An electronic circuit unit as defined in claim 1, wherein said motherboard frame is integrally formed of metallic material.

13. An electronic circuit unit as defined in claim 2, including a third locating retainer, said second main wall being mounted to said motherboard frame by said third locating retainer.

* * * * *